United States Patent
Yoshida et al.

(10) Patent No.: US 9,230,939 B2
(45) Date of Patent: Jan. 5, 2016

(54) METHOD FOR PRODUCING IMAGE PICKUP APPARATUS, METHOD FOR PRODUCING SEMICONDUCTOR APPARATUS, AND JOINED WAFER

(71) Applicant: OLYMPUS CORPORATION, Tokyo (JP)

(72) Inventors: Kazuhiro Yoshida, Nagano (JP); Noriyuki Fujimori, Suwa (JP); Takatoshi Igarashi, Ina (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 14/808,054

(22) Filed: Jul. 24, 2015

(65) Prior Publication Data

US 2015/0333037 A1    Nov. 19, 2015

Related U.S. Application Data

(63) Continuation of application No. 14/557,021, filed on Dec. 1, 2014, now Pat. No. 9,123,618, which is a continuation of application No. PCT/JP2013/060345, filed on Apr. 4, 2013.

(30) Foreign Application Priority Data

May 30, 2012   (JP) .................................. 2012-123225

(51) Int. Cl.
*H01L 21/00* (2006.01)
*H01L 25/04* (2014.01)
*H01L 25/00* (2006.01)

(52) U.S. Cl.
CPC .............. *H01L 25/042* (2013.01); *H01L 25/50* (2013.01)

(58) Field of Classification Search
CPC ....................................................... H01L 21/00
See application file for complete search history.

(56) References Cited

U.S. PATENT DOCUMENTS

| | | |
|---|---|---|
| 2006/0065964 A1 | 3/2006 | Ohsumi |
| 2008/0230898 A1 | 9/2008 | Meguro et al. |
| 2009/0053856 A1 | 2/2009 | Ohsumi |
| 2010/0127340 A1 | 5/2010 | Sugizaki |

FOREIGN PATENT DOCUMENTS

| | | |
|---|---|---|
| JP | 2006128625 A | 5/2006 |
| JP | 2008130738 A | 6/2008 |

(Continued)

OTHER PUBLICATIONS

International Search Report dated Jun. 4, 2013 received in International Application No. PCT/JP2013/060345.

*Primary Examiner* — Marvin Payen
(74) *Attorney, Agent, or Firm* — Scully, Scott, Murphy & Brown, P.C.

(57) ABSTRACT

A method for producing an image pickup apparatus includes: a process of fabricating a plurality of image pickup chips by cutting an image pickup chip substrate where light receiving sections and electrode pads are formed; a process of fabricating a joined wafer by bonding the image pickup chips to a glass wafer; a process of filling a gap between the plurality of image pickup chips with a sealing member made of a BCB resin or polyimide; a process of machining the joined wafer to reduce a thickness; a process of forming through-hole vias; a process of forming an insulating layer that covers the image pickup chips; a process of forming through-hole interconnections; a process of forming external connection electrodes, each of which is connected to each of the through-hole interconnections; and a process of cutting the joined wafer.

12 Claims, 13 Drawing Sheets

(56) References Cited

FOREIGN PATENT DOCUMENTS

| | | |
|---|---|---|
| JP | 2008235401 A | 10/2008 |
| JP | 2010120145 A | 6/2010 |
| JP | 2010245565 A | 10/2010 |
| JP | 2011181859 A | 9/2011 |
| JP | 2011243596 A | 12/2011 |
| WO | 2005022631 A1 | 3/2005 |
| WO | 2009088069 A1 | 7/2009 |
| WO | 2010147120 A1 | 12/2010 |

METHOD FOR PRODUCING IMAGE PICKUP APPARATUS, METHOD FOR PRODUCING SEMICONDUCTOR APPARATUS, AND JOINED WAFER

CROSS REFERENCE TO RELATED APPLICATION

This application is a continuation application of U.S. patent application Ser. No. 14/557,021 filed on Dec. 1, 2014, which is a continuation application of PCT/JP2013/060345 filed on Apr. 4, 2013 and claims benefit of Japanese Application No. 2012-123225 filed in Japan on May 30, 2012, the entire contents of each of which are incorporated herein by reference.

BACKGROUND OF THE INVENTION

1. Field of the Invention

The present invention relates to a method for producing an image pickup apparatus including a process of cutting a joined wafer where a plurality of image pickup chips are joined to a support substrate, a method for producing a semiconductor apparatus including a process of cutting a joined wafer where a plurality of semiconductor chips are joined to a support substrate, and the joined wafer.

2. Description of the Related Art

A chip size package (CSP) technology has been used for downsizing semiconductor apparatuses. In the CSP, in a semiconductor chip where a semiconductor circuit section is formed on a first main face, a through-hole interconnection is formed up to a second main face, and an external connection terminal on the second main face is connected to an interconnection board.

Here, in a small image pickup apparatus, a transparent support member that protects a light receiving section that is the semiconductor circuit section is joined to a first main face of an image pickup chip on which the light receiving section is formed. A wafer level chip size package (WL-CSP) technology has been used for collectively fabricating a plurality of image pickup apparatuses. In the WL-CSP, an image pickup chip substrate on which a plurality of light receiving sections are formed, and a transparent support substrate are subjected to machining such as formation of through-hole interconnections in a joined wafer state in which the image pickup chip substrate and the transparent support substrate are bonded via an adhesive layer. After that, the joined wafer is individualized into individual image pickup apparatuses.

Note that Japanese Patent Application Laid-Open Publication No. 2011-243596 discloses a method for producing a package component by a CSP method in which semiconductor chips mounted on a mounting face of a silicon wafer are sealed by a sealing resin, and the silicon wafer is then polished or the like from an opposite face to the mounting face, and further individualized into individual package components.

That is, in the above production method, the semiconductor chips are not machined, but the silicon wafer is machined to become an interposer for the semiconductor chips.

SUMMARY OF THE INVENTION

A method for producing an image pickup apparatus of an embodiment of the present invention includes: a process of fabricating a plurality of image pickup chips by cutting an image pickup chip substrate where a plurality of light receiving sections are formed on a first main face and electrode pads are formed around each of the light receiving sections; a process of fabricating a joined wafer by bonding the first main face of each of the image pickup chips to a transparent support substrate via a transparent adhesive layer; a process of filling a gap between the plurality of image pickup chips bonded to the joined wafer with a sealing member made of a BCB resin or polyimide; a process of machining the joined wafer from a second main face side to reduce a thickness; a process of forming an etching mask on the second main face; a process of forming through-hole vias in the image pickup chips by using the etching mask; a process of stripping the etching mask; a process of forming an insulating layer that covers the second main face of the image pickup chips, a surface of the sealing member, and a wall face of the through-hole vias; a process of forming through-hole interconnections, each of which is connected to each of the electrode pads via each of the through-hole vias; a process of forming external connection electrodes, each of which is connected to each of the through-hole interconnections on the second main face; and a process of cutting the joined wafer.

Also, a method for producing a semiconductor apparatus of another embodiment includes: a process of fabricating a plurality of semiconductor chips by cutting a semiconductor chip substrate where a plurality of semiconductor circuit sections are formed on a first main face and electrode pads are formed around each of the semiconductor circuit sections; a process of fabricating a joined wafer by bonding the first main face of each of the semiconductor chips to a support substrate via an adhesive layer; a process of filling a gap between the plurality of semiconductor chips bonded to the joined wafer with a sealing member made of a BCB resin or polyimide; a process of machining the joined wafer from a second main face side to reduce a thickness; a process of forming an etching mask on the second main face; a process of forming through-hole vias in the semiconductor chips by using the etching mask; a process of stripping the etching mask; a process of forming an insulating layer that covers the second main face of the semiconductor chips, a surface of the sealing member, and a wall face of the through-hole vias; a process of forming through-hole interconnections, each of which is connected to each of the electrode pads via each of the through-hole vias; a process of forming external connection electrodes, each of which is connected to each of the through-hole interconnections on the second main face; and a process of cutting the joined wafer.

Also, a joined wafer of another embodiment includes: a plurality of image pickup chips each including through-hole vias that penetrate through between a first main face and a second main face; a transparent support substrate bonded on the first main face of each of the plurality of image pickup chips via a transparent adhesive layer; and a sealing member made of a BCB resin or polyimide, the sealing member being filled in a gap between the plurality of image pickup chips bonded to the transparent support substrate, wherein a surface of the sealing member and a wall face of each of the through-hole vias are covered with an insulating layer, and each of the image pickup chips includes: a light receiving section formed on the first main face; electrode pads formed around the light receiving section; through-hole interconnections, each of which is connected to each of the electrode pads via each of the through-hole vias; and external connection electrodes, each of which is connected to each of the through-hole interconnections and formed on the second main face.

A joined wafer of another embodiment includes: a plurality of semiconductor chips each including through-hole vias that penetrate through between a first main face and a second main face; a transparent support substrate bonded on the first main face of each of the plurality of semiconductor chips via a transparent adhesive layer; and a sealing member made of a BCB resin or polyimide, the sealing member being filled in a gap between the plurality of semiconductor chips bonded to the transparent support substrate, wherein a surface of the sealing member and a wall face of each of the through-hole vias are covered with an insulating layer, and each of the semiconductor chips includes: a semiconductor circuit section formed on the first main face; electrode pads formed around the semiconductor circuit section; through-hole interconnections. each of which is connected to each of the electrode pads via each of the through-hole vias; and external connection electrodes, each of which is connected to each of the through-hole interconnections and formed on the second main face.

DETAILED DESCRIPTION OF THE PREFERRED EMBODIMENT

Embodiment

Figure 1:
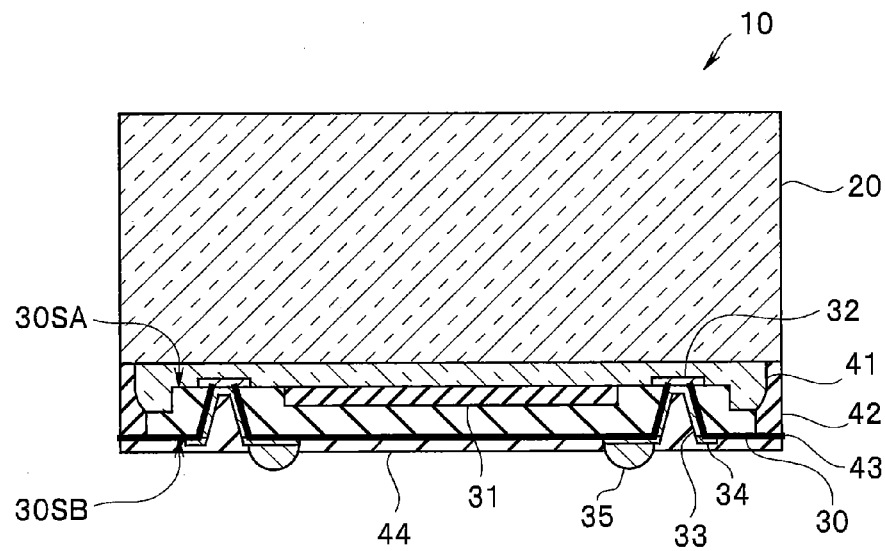
FIG. 1 is a sectional view of an image pickup apparatus of an embodiment.

As shown in FIG. 1, in an image pickup apparatus 10 that is a semiconductor apparatus, an image pickup chip (imager chip) 30, and a cover glass 20 that is a support substrate section (transparent flat plate section) are bonded via an adhesive layer 41 made of a transparent resin. A light receiving section 31 that is a semiconductor circuit section is formed on a first main face 30SA of the image pickup chip 30, and a plurality of electrode pads 32 connected to the light receiving section 31 by an interconnection (not shown) are further formed around the light receiving section 31 of the first main face 30SA. The electrode pad 32 is connected to an external connection electrode 34 and an external connection terminal 35 on a second main face 30SB via a through-hole interconnection 33. That is, the plurality of electrode pads 32 supply electricity to the light receiving section 31, and transmit and receive input and output signals to and from the light receiving section 31. Moreover, outer peripheral portions of the image pickup chip 30 and outer peripheral portions of the adhesive layer 41 are covered with a sealing member 42 with no gap therebetween.

An insulating layer 43 covers and protects a surface of the sealing member 42 and the second main face 30SB of the image pickup chip 30 as well as covering a wall face of a through-hole via to effect insulation between silicon as a base material of the image pickup chip 30 and the through-hole interconnection 33. Furthermore, a region of the second main face 30SB other than an external connection electrode formation region is covered with a protective layer 44.

Figure 2:
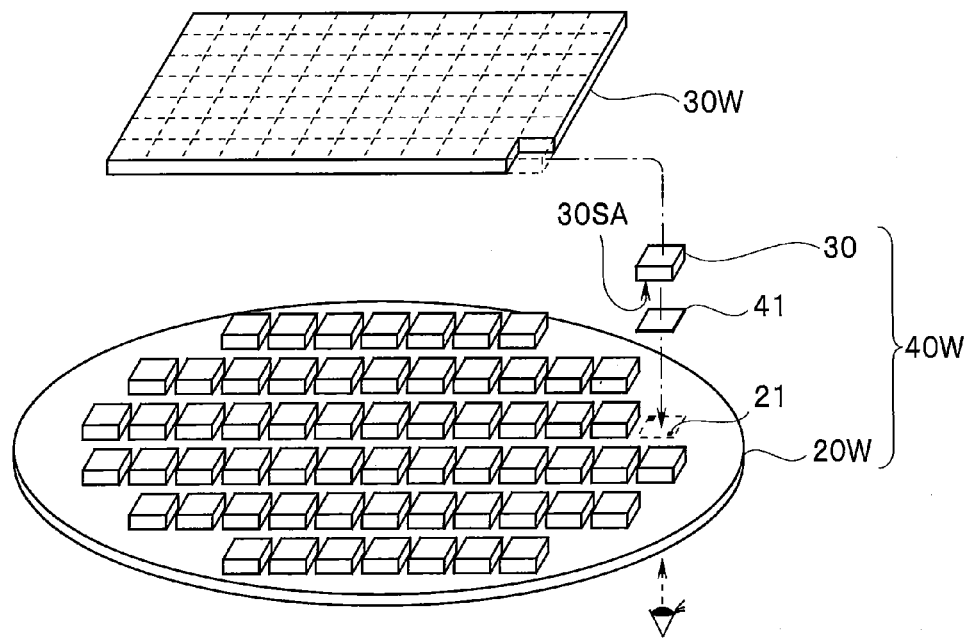
FIG. 2 is a perspective view for explaining a method for producing the image pickup apparatus of the embodiment.

That is, in the image pickup apparatus 10, a plan-view dimension of the cover glass 20 is larger than a plan-view dimension of the image pickup chip 30. This is because the image pickup apparatus 10 is fabricated by cutting (individualizing) a joined wafer 40W where a plurality of image pickup chips 30 are bonded to a glass wafer 20W, which is a transparent support substrate that becomes the cover glass 20, away from each other by a predetermined length via the adhesive layer 41 as shown in FIG. 2. As described below, on the glass wafer 20W, an alignment mark 21 for arranging each of the image pickup chips 30 at a predetermined position is formed. That is, since the glass wafer 20W is transparent, the alignment mark (first alignment mark) 21 and an alignment mark (second alignment mark) 36 (see FIG. 5) on the image pickup chip 30 can be aligned with each other from an opposite face to a face where the alignment mark 21 is formed.

Figure 3A:
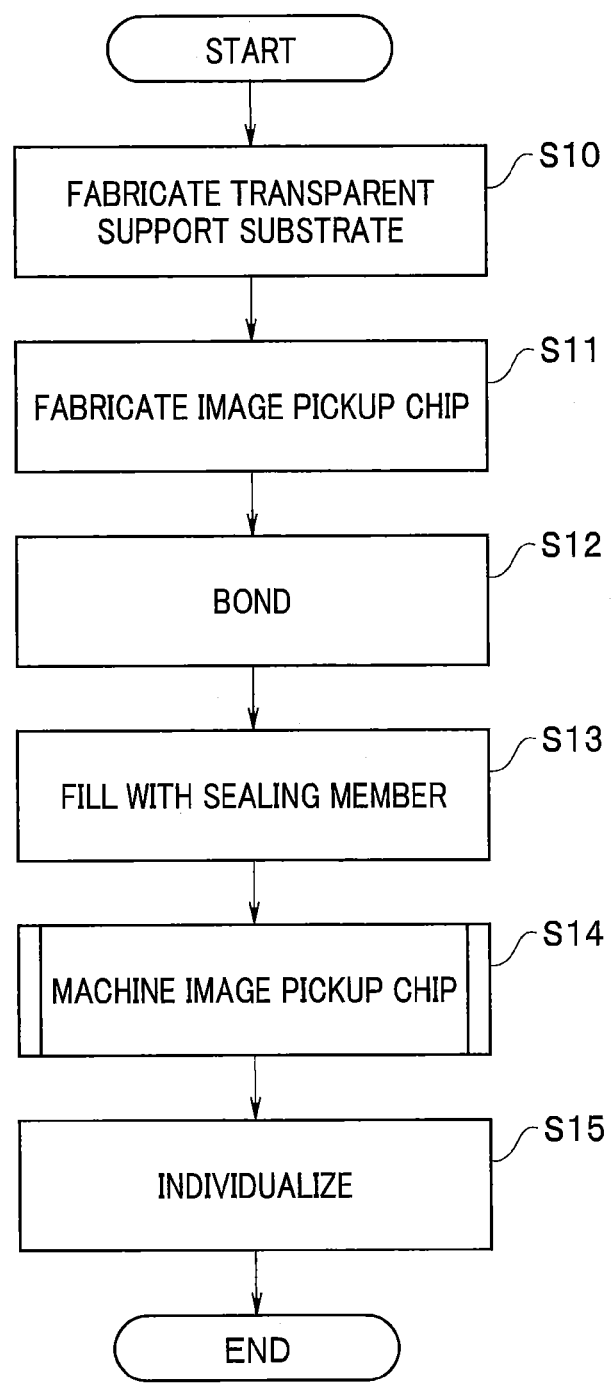
FIG. 3A is a flowchart for explaining the method for producing the image pickup apparatus of the embodiment.
Figure 3B:
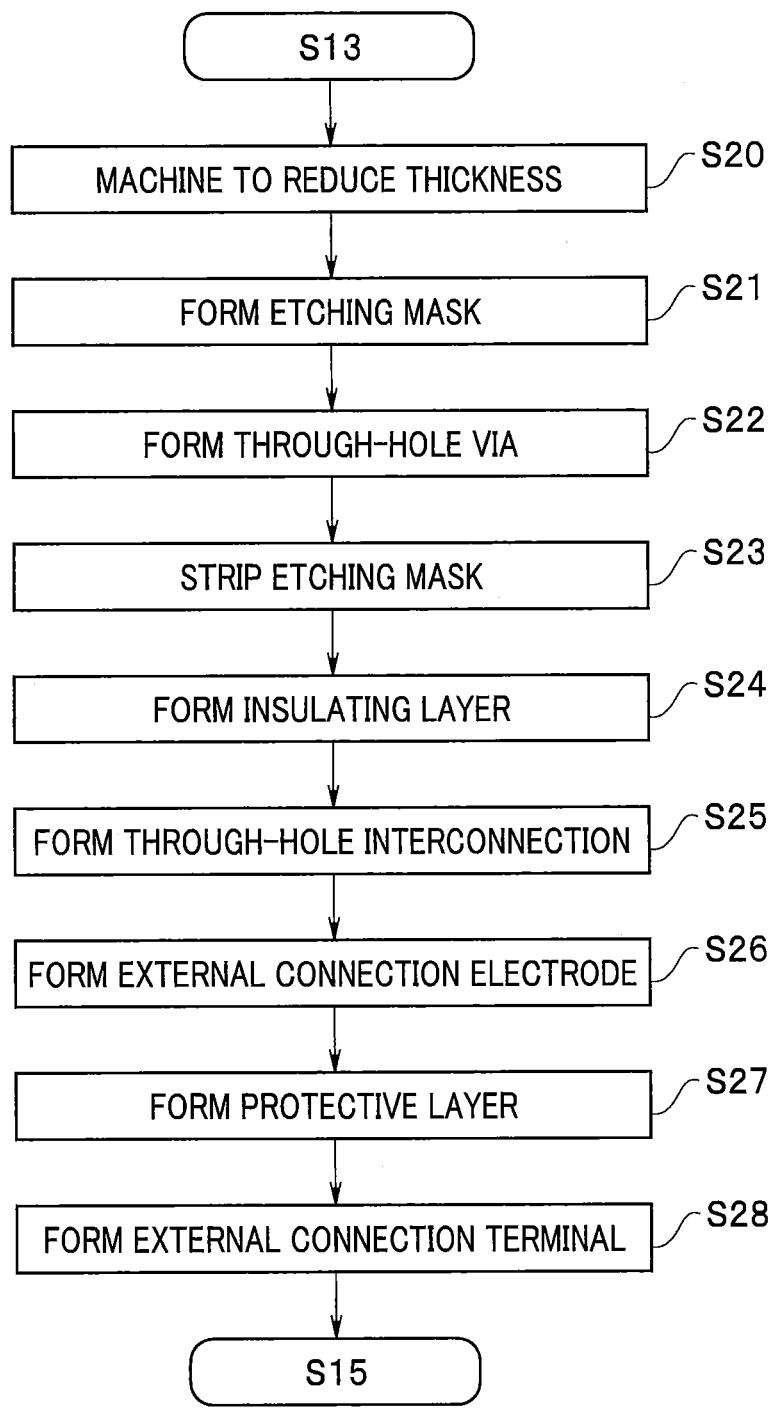
FIG. 3B is a flowchart for explaining the method for producing the image pickup apparatus of the embodiment.

Next, a method for producing the image pickup apparatus 10 of the embodiment is described in detail based on flowcharts in FIGS. 3A and 3B.

<Step 10> Glass Wafer Fabricating Process

Figure 4:
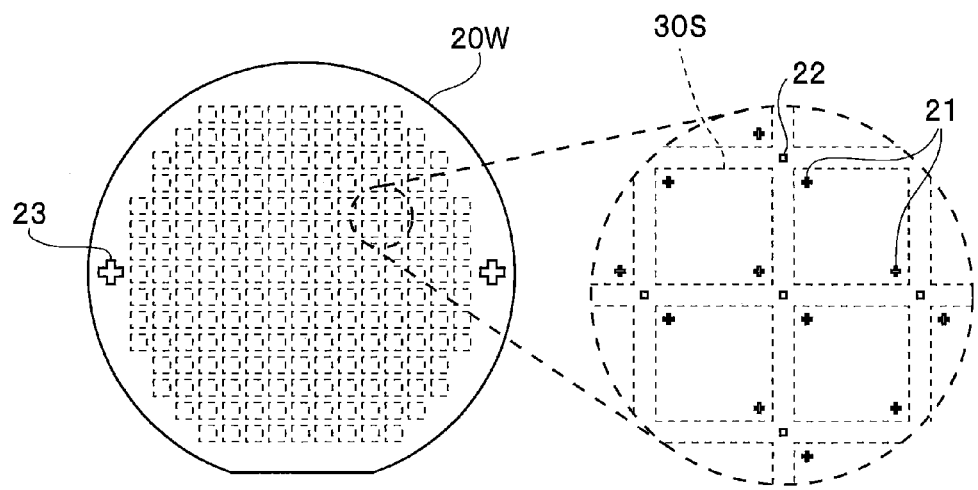
FIG. 4 is a plan view and a partially enlarged view of a transparent substrate of the image pickup apparatus of the embodiment.

As shown in FIG. 4, the alignment marks 21 for arranging the image pickup chips 30 at predetermined positions are formed on the glass wafer 20W that is the transparent support substrate. Note that an image pickup chip arrangement region 30S is indicated by a broken line for the sake of description in FIG. 4. The glass wafer 20W that is cut to become the cover glass 20 only needs to be transparent in a wavelength band of light for image pickup. For example, borosilicate glass, quartz glass, or single crystal sapphire is used.

Note that alignment marks 22 and alignment marks 23 are formed at the same time as formation of the alignment marks

21. The alignment marks 22 are used for dicing at a time of individualization, and the alignment marks 23 are used for machining such as formation of the through-hole interconnection 33 in the image pickup chip 30. The alignment marks 21 and the like are formed by, for example, performing patterning by photolithography after forming a metal layer of Al or the like on an entire face. It is preferable that two alignment marks be provided for one time of positioning processing for the respective alignment marks so as to perform accurate positioning. Note that the alignment marks 21 and the like may be also formed by partially etching the glass wafer 20W.

Note that a back face of the glass wafer 20W (the opposite face to the face where the alignment marks 21 are formed), which is not machined in following processes, may be covered with a photoresist or the like to be protected.

<Step 11> Image Pickup Chip Fabricating Process

Figure 5:
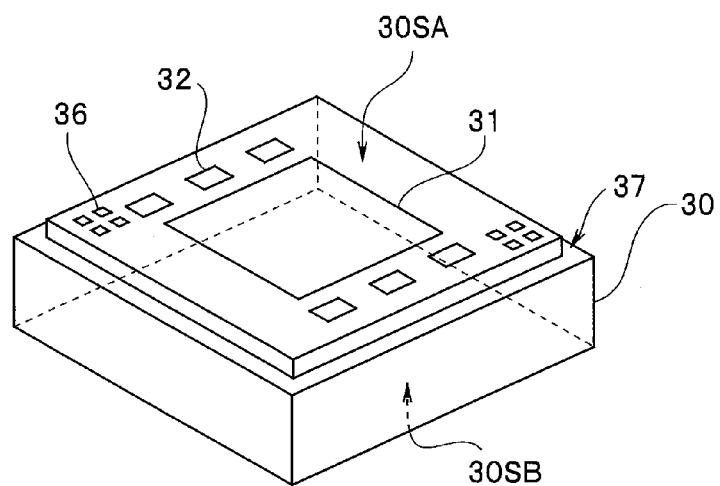
FIG. 5 is a perspective view of an image pickup chip of the image pickup apparatus of the embodiment.

The plurality of light receiving sections 31 that are the semiconductor circuit sections, the plurality of electrode pads 32 connected to each of the light receiving sections 31, and the plurality of alignment marks 36 are formed on the first main face 30SA of a semiconductor wafer such as a silicon wafer by a known semiconductor process, so that an image pickup chip substrate 30W (see FIG. 2) is fabricated. By cutting the image pickup chip substrate (semiconductor chip substrate) 30W, the plurality of image pickup chips (semiconductor chips) 30 shown in FIG. 5 are fabricated.

Sizes of the image pickup chip substrate and the glass wafer 20W are selected according to available production equipment or the like depending on a form and specifications etc. of the image pickup apparatus to be produced. Also, the image pickup chip substrate and the glass wafer 20W may be set to different sizes. For example, even when the image pickup chips are formed from a substrate having a large diameter of 12-inch (300-mm) φ, or from a still larger substrate, the individualized image pickup chips 30 are re-arrayed (bonded) on the glass wafer 20W of 8-inch (200-mm) φ, and subjected to machining. Accordingly, it becomes possible to produce the image pickup apparatus by equipment for 8-inch (200-mm) φ without using equipment or the like compatible with a large-diameter wafer. Moreover, a substrate and a wafer of different shapes, for example, the image pickup chip substrate of 8-inch (200-mm) φ and the glass wafer 20W of 6-inch (150-mm) squares, may be also used depending on equipment and apparatuses, etc. As described above, since the image pickup chip substrate and the glass wafer 20W of suitable sizes or shapes for available production equipment or the like (a production apparatus, a jig and a tool, etc.) can be used, the image pickup apparatus can be produced by effectively utilizing existing equipment or the like.

In following processes, only the image pickup chips 30 determined as non-defective products in an inspection process are used. That is, "defective chips" other than the non-defective products are not used in the following processes. Thus, even when a yield rate of the image pickup chips 30 of the image pickup chip substrate 30W is low, a decrease in yield rate of the image pickup chips obtained by re-arraying and re-machining the image pickup chips is not caused. Note that it is preferable to perform an inspection for determining defectiveness of the image pickup chips on the image pickup chips 30 in a state of the image pickup chip substrate 30W in view of work efficiency although the inspection may be performed on each of the individual image pickup chips 30 in an individualized state.

The alignment marks 36 correspond to the alignment marks 21 on the glass wafer 20W. As shown in FIG. 5, the alignment marks 36 are preferably formed respectively on outer peripheral portions facing each other with a center of the image pickup chip 30 therebetween. By previously forming the alignment marks on the glass wafer 20W and the image pickup chip 30, the image pickup chip 30 can be automatically placed with high precision by using a mounting apparatus.

Also, a step portion 37 is formed in the outer peripheral portions of the first main face 30SA of the image pickup chip 30. The step portion 37 is fabricated by dicing the image pickup chip substrate 30W by step cutting. The image pickup chip 30 with the step portion 37 can reduce a length L with an adjacent chip so as to prevent spread (a fillet) of an adhesive 41L to an outer side of the image pickup chip 30 when bonded to the glass wafer 20W. A micro lens group may be also disposed on the light receiving section 31.

<Step S12> Bonding Process

Figure 6A:
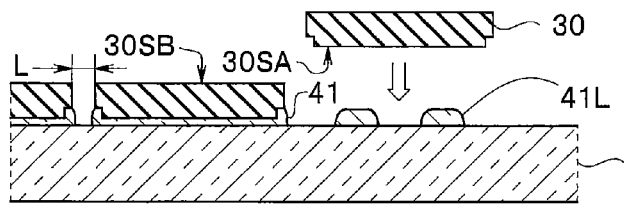
FIG. 6A is a sectional view for explaining the method for producing the image pickup apparatus of the embodiment.

As shown in FIG. 6A, the plurality of image pickup chips 30 are bonded to the glass wafer 20W away from each other by the predetermined length L to fabricate the joined wafer 40W. That is, the plurality of image pickup chips 30 formed on the image pickup chip substrate 30W on predetermined array conditions are then re-arrayed on the glass wafer 20W after cutting.

The length L needs to be longer than a thickness of a dicing blade used in a dicing process described below. However, if the length L is too long, the number of image pickup apparatuses that can be fabricated from the single glass wafer 20W is decreased. At the same time, the sealing member has a larger volume in a sealing member filling process described below, and a curing shrinkage stress becomes larger, so that a crack is easily generated. Therefore, the length L is preferably 15 μm or more and 500 μm or less, which is slightly longer than the thickness of the dicing blade.

Also, by setting the length L to a constant value among all of the image pickup chips 30, workability can be improved, and uniform filling of the sealing member is enabled in the sealing member filling process described below. The crack caused by unevenness of the curing shrinkage stress can be thereby prevented.

For example, the adhesive 41L in a liquid form is first applied in an appropriate amount to five positions of the image pickup chip arrangement region 30S of the glass wafer 20W. The image pickup chip arrangement region 30S can be grasped by the two alignment marks 21 arranged on a diagonal line. For example, a dispensing method of pushing out a solution from a distal-end nozzle of a dispenser and applying the solution is used as an application method.

As the adhesive 41L, a BCB (benzocyclobutene) resin, an epoxy-based resin, or a silicone-based resin etc., which satisfies such properties that the adhesive has high transparency (for example, a transmittance at visible wavelengths is 90% or more), has high adhesive strength, and is not deteriorated by heat or the like in subsequent processes, is used.

The image pickup chip 30 is then bonded to the glass wafer 20W in a state in which the first alignment marks 21 on the glass wafer 20W and the second alignment marks 36 on the first main face 30SA of the image pickup chip 30 are aligned with each other by using, for example, a flip chip bonder. The first alignment marks 21 and the second alignment marks 36 are set so as to be easily aligned with each other. For example, the first alignment mark 21 has a cross shape as shown in FIG. 4, and the second alignment mark 36 is composed of four squares as shown in FIG. 5.

Note that a reference mark may be previously formed on the glass wafer 20W without forming the alignment marks exclusive for the respective image pickup chips, and the image pickup chips 30 may be arranged at a predetermined pitch based on the reference mark. A throughput can be raised by using the above method. Also, alignment may be performed by using a pattern of the electrode pads 32 or the like formed on the image pickup chip 30 instead of the second alignment marks 36.

The liquid adhesive 41L is cured in a state in which the alignment marks are aligned with each other, and becomes the adhesive layer 41. By completely curing the liquid adhesive 41L while pressing the second main face of the image pickup chip at a predetermined pressure by a wafer-shaped pressing jig, parallelism between the main face of the image pickup chip and the main face of the glass wafer 20W is increased.

As a method for curing the adhesive 41L, any of a thermal curing method, a UV curing method, the UV curing method+ the thermal curing method, the UV curing method+a moisture curing method, and a room temperature curing method etc. may be employed depending on the resin as long as desired properties are satisfied. By using a flip chip bonder including means for curing the adhesive 41L, such as a heating section or a UV irradiation section, the arrangement of the image pickup chip 30 at a predetermined position, and the curing of the adhesive 41L can be performed at the same time.

Note that attention needs to be paid when the adhesive 41L where voids are easily generated by rapid curing is used although the adhesive 41L may be completely cured by the flip chip bonder. In this case, it is preferable that, for example, when the adhesive 41L is cured by the flip chip bonder, the adhesive 41L be semi-cured to an extent where the image pickup chip 30 disposed at a predetermined position does not move to cause displacement, and after the plurality of image pickup chips 30 are disposed on the glass wafer 20W, the adhesive 41L is completely cured at a time and formed into the adhesive layer 41.

<Step S13> Sealing Member Filling Process

Figure 6B:
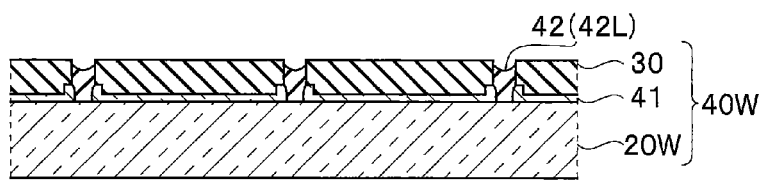
FIG. 6B is a sectional view for explaining the method for producing the image pickup apparatus of the embodiment.

As shown in FIG. 6B, a sealing resin 42L in a liquid form that is filled into a gap between the plurality of image pickup chips 30 disposed on the glass wafer 20W by, for example, a dispensing method is cured to become the sealing member 42. The sealing resin 42L may be also poured into the gap instead of the dispensing method.

By setting the arrangement length L between the plurality of image pickup chips 30 to 15 µm or more and 500 µm or less, the sealing member can be filled into the gap between the plurality of image pickup chips 30 by a capillary tube phenomenon. Note that a region where vertexes of the plurality of image pickup chips 30 face each other tends to have a small height (thickness) when filled with the sealing resin 42L. Therefore, after the sealing resin is cured once, the sealing resin may be applied again only to the portion where the vertexes of the plurality of image pickup chips 30 face each other.

The sealing member 42 preferably has a low moisture vapor transmission rate so as to improve humidity resistance of the image pickup apparatus 10, and is difficult to deteriorate by heat or plasma in subsequent processes. For example, a BCB resin or polyimide is used. Note that the sealing member 42 may be made of the same material as or a different material from the adhesive layer 41.

Also, the sealing member 42 preferably has a function as a light shielding member that prevents entrance of external light into the light receiving section. To this end, even when the sealing member 42 is made of the same resin as the adhesive layer 41, the resin is preferably used by mixing a light shielding material such as a dye or a black pigment therein. Note that a non-conductive material is used when the pigment or the like is used since the sealing member 42 needs to be an insulator.

A thickness of the sealing member 42, namely, a height to be filled only needs to be larger than a thickness of the image pickup chip 30 after thinning in step S14. That is, it is not necessary to completely fill the space between the plurality of image pickup chips 30 with the sealing member 42 before the thinning machining. Conversely, the sealing member 42 may protrude from the space between the image pickup chips 30.

Note that it is preferable not to perform rapid heating or rapid cooling in the curing of the sealing resin 42L in order to prevent the crack occurrence due to the shrinkage stress when the sealing resin 42L is cured. Also, it is preferable that the sealing resin 42L be defoamed in vacuum before curing, or is cured in vacuum in order to prevent the occurrence of voids.

Note that the sealing member 42 is not limited to the cured liquid resin. For example, a sheet-like resin member may be cured after filling the space between the image pickup chips 30 wile embedding the image pickup chips 30 by vacuum hot pressing or vacuum laminating.

<Step S14> Image Pickup Chip Machining Process

An image pickup chip machining subroutine is shown in FIG. 3B.

<Step S20> Thickness Reduction Machining Process

Figure 6C:
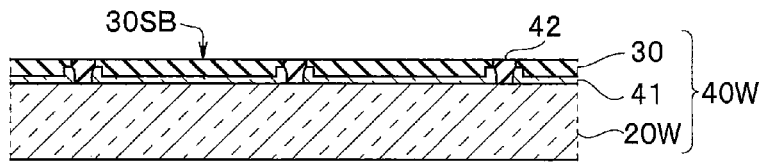
FIG. 6C is a sectional view for explaining the method for producing the image pickup apparatus of the embodiment.

As shown in FIG. 6C, the joined wafer 40W is thinned, so that an image pickup chip bonded face (the second main face 30SB) side is flattened. That is, a back grinding process and a CMP (chemical mechanical polishing) process are performed from the second main face 30SB side.

In the back grinding process, a diamond wheel called a back grinding wheel is used. The CMP process is performed for reducing surface roughness of a surface grinded in the back grinding process.

Note that when a surface of the joined wafer 40W has large irregularities after being filled with the sealing member, pre-processing by another means is preferably performed before the back grinding process. For example, as the preprocessing, the sealing member 42 protruding from the gap between the image pickup chips 30 is shaved by a blade.

Note that dishing, which forms a recess in a center portion of the surface of the sealing member 42, may occur by the back grinding process and the CMP process. However, since the recessed portion is removed in the dicing process, there occurs no problem.

The second main face 30SB of the image pickup chip 30 and the surface of the sealing member 42 on the joined wafer 40W after thinning form a flat face. Therefore, a similar process to that of a normal semiconductor wafer can be performed on the thinned joined wafer 40W.

Figure 6D:
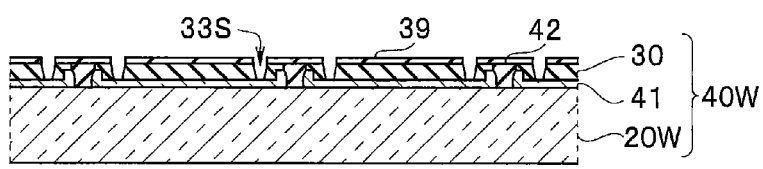
FIG. 6D is a sectional view for explaining the method for producing the image pickup apparatus of the embodiment.

That is, as shown in FIG. 6D, a through-hole via 33S for forming the through-hole interconnection 33 that is connected to the electrode pad 32 formed on the first main face 30SA of the image pickup chip 30 is formed by the normal semiconductor wafer process.

<Step S21> Etching Mask Forming Process

As shown in FIG. 6D, to form the through-hole via, an etching mask 39 having an opening in a region immediately above each of the electrode pads 32 is formed on the image pickup chips 30 and the sealing member 42. The etching mask 39 also serves as a protective layer for protecting the image pickup chips 30 and the sealing member 42 from chemicals and plasma used in a subsequent process.

As the etching mask 39, an inorganic film such as a silicon oxide film or a silicon nitride film, or an organic film such as a photoresist, polyimide, or BCB is used. When the inorganic film is used as the etching mask 39, the inorganic film is formed by using plasma CVD or optical CVD. Since the film formation methods are performed at low temperature, no damage is caused on the semiconductor circuit section (the light receiving section 31) or the like formed on the image pickup chip 30. As a source gas when the silicon oxide film is formed, tetraethoxysilane (TEOS) or octamethylcyclotetrasiloxane (OMCTS) etc. is used. Also, as a source gas when the silicon nitride film is formed, a mixture gas such as $SiH_4$+ $NH_3$, $SiH_2CL_2$+$NH_3$, $SiH_4$+$N_2$, or $SiH_4$+$NH_3$+$N_2$ is used.

On the other hand, when the organic film is used as the etching mask 39, the organic film is formed by spin coating, spray coating, or screen printing, etc.

To strip the etching mask 39 in a subsequent process, the etching mask 39 made of a different material from the sealing member 42 is used. For example, when the sealing member 42 is made of polyimide, for example, the silicon oxide film or the silicon nitride film is used as the etching mask 39. Since the film formation can be performed at low temperature as the method for forming the etching mask 39, and no damage is caused on the semiconductor circuit section or the like formed on the image pickup chip 30, plasma CVD is preferably used.

Note that the alignment marks 23 for forming the through-hole interconnection, which are previously formed on the glass wafer 20W, are used for alignment of a photo mask used when a patterning mask (not shown) for forming the opening in the etching mask 39 is formed.

When the silicon oxide film, the silicon nitride film, or a non-photosensitive resin is used as the etching mask 39, the mask is etched with a photoresist with an opening pattern to form the opening. In the silicon oxide film or the like, dry etching using a fluorine-based gas such as $CF_4$, $CHF_3$, or $C_2F_6$ is performed. On the other hand, when a photosensitive resin is used, the etching mask 39 with the opening can be formed by photolithography patterning.

<Step S22> Through-Hole Via Forming Process

The through-hole via 33S is formed using the etching mask 39 by the normal semiconductor wafer process.

For example, the through-hole via 33S reaching the electrode pad 32 is formed by wet etching using an alkali solution such as KOH or TMAH, or dry etching by an ICP-RIE method or the like.

The through-hole via 33S formed by the wet etching has a tapered shape where an opening size in the first main face 30SA is smaller than an opening size in the second main face 30SB. This is because when the image pickup chip 30 is made of single crystal silicon (100), anisotropic etching is caused in which an etching rate in a <100> plane direction is relatively higher than an etching rate in a <111> plane direction.

Furthermore, in the etching of the through-hole via 33S, side etching occurs in which the opening size in the second main face 30SB becomes larger than an opening size in the etching mask 39. Therefore, the opening size in the etching mask 39 is set to be smaller than a target opening size in the second main face 30SB. In the through-hole via forming process, the etching mask 39 protects the sealing member 42 from the alkali solution.

Note that the through-hole via 33S may be also formed by the dry etching such as ICP-RIE, or a physical machining method such as laser machining.

<Step S23> Etching Mask Stripping Process

The etching mask 39 is stripped. As a stripping method, a removing method with high etch selectivity between the etching mask 39 and the sealing member 42 is selected. For example, when the sealing member 42 is made of polyimide and the etching mask 39 is the silicon oxide film, a wet stripping method using a fluorine-based solution such as BHF is used.

<Step S24> Insulating Layer Forming Process

Figure 6E:
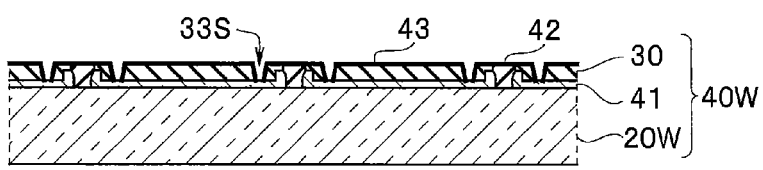
FIG. 6E is a sectional view for explaining the method for producing the image pickup apparatus of the embodiment.

As shown in FIG. 6E, the insulating layer 43 is formed in which an opening is patterned in a bottom face of the through-hole via 33S such that the electrode pad 32 is exposed with the second main face 30SB of the image pickup chip 30, and the surface of the sealing member 42, and a wall face of the through-hole via 33S covered. An insulating material similar to that of the etching mask 39 is used for the insulating layer 43. As a method for forming the insulating layer and a method for patterning the opening, a formation method similar to or different from that of the etching mask 39 may be employed.

Since the insulating layer 43 is not stripped in following processes, the insulating layer 43 protects the sealing member 42 in the following processes. For example, the insulating layer 43 protects the sealing member 42 from chemical treatment or plasma treatment during patterning in a through-hole interconnection forming process in step S25.

<Step S25> Through-Hole Interconnection Forming Process

Figure 6F:
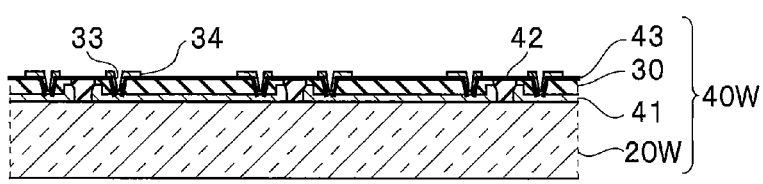
FIG. 6F is a sectional view for explaining the method for producing the image pickup apparatus of the embodiment.

As shown in FIG. 6F, after the insulating layer 43 is formed on the wall face of the through-hole via 33S or the like, the through-hole interconnection 33 composed of a conductor is formed in an inner portion of the through-hole via 33S. The through-hole interconnection 33 is formed by patterning after forming a conductive film of aluminum or copper etc. using a sputtering method or a deposition method. Note that a plating process may be used in the through-hole interconnection forming process.

<Step S26> External Connection Electrode Forming Process

After the through-hole interconnection is formed, the external connection electrode 34 connected to the through-hole interconnection 33 is formed on the second main face 30SB of the image pickup chip 30. Note that the external connection electrode 34 may be also formed at the same time as the formation of the through-hole interconnection.

<Step S27> Protective Layer Forming Process

Figure 6G:
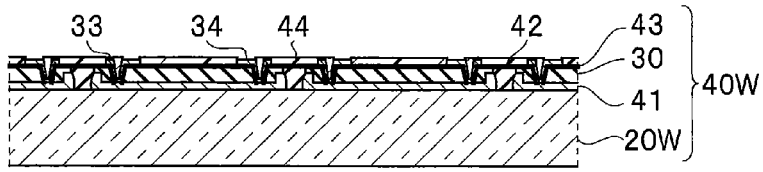
FIG. 6G is a sectional view for explaining the method for producing the image pickup apparatus of the embodiment.
Figure 6H:
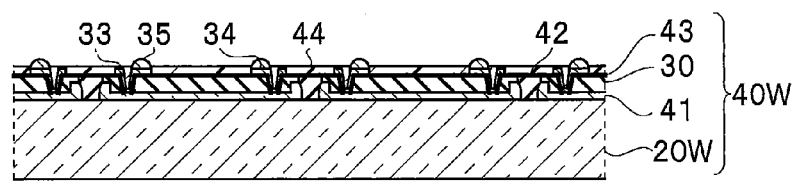
FIG. 6H is a sectional view for explaining the method for producing the image pickup apparatus of the embodiment.

As shown in FIG. 6G, the protective layer 44 having an opening where a portion of the external connection electrode 34 is exposed is formed. The protective layer 44 may be formed of a material and by a formation method similar to those of the etching mask 39 or the like, or of a different material and by a different formation method therefrom.

<Step S28> External Connection Terminal Forming Process

The projecting external connection terminal 35 for effecting electrical connection with outside is disposed in the opening of the protective layer 44 on the external connection electrode 34. Note that a plating process may be used in the through-hole interconnection forming process or the like, and a solder ball etc. may be used for the external connection terminal 35.

<Step S15> Individualizing Process (Dicing Process)

A plurality of image pickup apparatuses 10 are fabricated from the single joined wafer 40W by an individualizing process of cutting the joined wafer 40W.

Figure 6I:
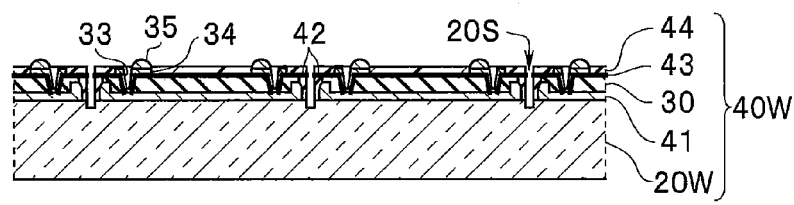
FIG. 6I is a sectional view for explaining the method for producing the image pickup apparatus of the embodiment.
Figure 6J:
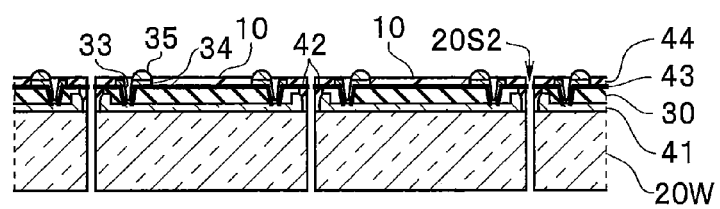
FIG. 6J is a sectional view for explaining the method for producing the image pickup apparatus of the embodiment.

For cutting, a two-stage dicing method shown in FIGS. 6I and 6J is preferable. That is, after the joined wafer 40W is half-cut to about 10 to 200 μm from a surface of the glass wafer 20W (an upper side in the drawings), the glass wafer 20W is subjected to full-cut dicing, so that a crack occurrence due to a stress and stripping of the sealing member 42 can be prevented. Moreover, in the two-stage dicing method, a blade type (a bond material, an abrasive grain diameter, a degree of concentration) and machining conditions (a feed speed, a rotation speed) suitable for resin are used for dicing the sealing member 42, and a blade type and machining conditions suitable for glass are used for dicing the glass wafer 20W. A machining quality (resin burrs, chipping of glass, and delamination of a resin layer) can be thereby improved. Also, step cutting by which a step is formed in end portions of the individualized image pickup chips 30 may be performed by setting the blade for resin to a larger thickness than the blade for glass.

Also, the glass wafer 20W may be subjected to full-cut dicing by blade dicing for glass or laser dicing, and thereby individualized after removing the sealing member 42 on a dicing line by laser dicing or etching.

In alignment of dicing, the alignment marks 22 firstly formed on the glass wafer 20W are used. Note that, instead of the alignment marks 22, an alignment mark for dicing may be formed on the second main face 30SB of the image pickup chip 30 or on the sealing resin between the image pickup chips 30 in the through-hole interconnection forming process or the like.

In the production method of the embodiment, even when the image pickup chip substrate 30W has a low yield rate of image pickup devices, the joined wafer 40W is fabricated by using only the non-defective image pickup chips 30. Therefore, the defective chip is not produced into the image pickup apparatus, so that the image pickup apparatus 10 can be produced at low cost, and productivity is high.

Also, in the production method of the embodiment, the image pickup apparatus can be produced by using the joined wafer 40W with a predetermined diameter regardless of the diameter of the image pickup chip substrate 30W. Since machining equipment compatible with a large diameter is unrequired, productivity is high.

Moreover, since the image pickup chip with a large thickness before being machined is bonded to the glass wafer 20W, the image pickup chip is easily handled. That is, the image pickup chip that is thinned for forming the through-hole interconnection is easily damaged, and easily deformed by a stress during bonding or the like. However, in the production method of the embodiment, the image pickup chip in a thick state can be bonded to the glass wafer 20W.

Also, since the support substrate is the transparent glass wafer 20W, alignment using the alignment marks can be performed from the opposite face to the image pickup chip bonded face as shown in FIG. 2.

Furthermore, when the joined wafer 40W is machined from the second main face 30SB side by the wafer process, the sealing member 42 is covered with and protected by the etching mask 39 or the insulating layer 43. Therefore, the sealing member 42 is not deteriorated, so that the highly-reliable image pickup apparatus can be produced by the production method of the image pickup apparatus of the embodiment.

Also, since the chip arrangement length is set to a constant value, it is easy to fill the sealing resin 42L, thereby preventing the crack in the sealing resin 42L. Thus, a production yield rate is high.

Moreover, the image pickup chip 30 and the sealing member 42 can be treated as a single wafer by making the outer face of the image pickup chip 30 and the outer face of the sealing member 42 flush with each other by the CMP. Thus, the semiconductor wafer process can be performed on a chip-shaped component, and high-precision and high-density machining can be performed.

The image pickup apparatus 10 includes the image pickup chip 30 that is the semiconductor chip where the light receiving section 31 that is the semiconductor circuit section is formed on the first main face 30SA, the cover glass 20 that is the support substrate section having a larger plan-view dimension than the image pickup chip 30, the transparent adhesive layer 41 that bonds the first main face 30SA of the image pickup chip 30 and the cover glass 20, and the sealing member 42 that covers a side face of the image pickup chip 30 and a side face of the adhesive layer 41, and is made of an insulating material having a same outer dimension as the cover glass 20.

That is, the side face of the image pickup chip 30 is covered with the sealing member 42, and the image pickup chip 30 is not exposed outside. Therefore, the image pickup apparatus 10 has excellent electrical insulating properties and humidity resistance.

Note that a functional member may be further added to the image pickup apparatus 10 of the above embodiment. For example, an objective lens unit may be joined to the opposite face to the face of the glass wafer 20W where the image pickup chip 30 is bonded in alignment with the image pickup chip 30. Also, a digital signal processor (DSP) chip for processing an image pickup signal may be joined to the second main face 30SB of the image pickup chip 30.

A backside irradiation-type image pickup apparatus may be also produced through processes of bonding an interconnection layer side of the image pickup chip 30 to the support substrate, filling the sealing resin into the gap between the image pickup chips 30, thinning the image pickup chip 30 to about 3 μm to expose the light receiving section 31, thereafter forming a color filter and a micro lens on the light receiving section 31, and removing a silicon layer on the electrode to expose the electrode.

Also, the semiconductor chip is not limited to the image pickup chip, and any type, such as general semiconductor chips, various sensors or actuators, may be employed. The semiconductor apparatus to be produced is also not limited to the image pickup apparatus.

Since the image pickup apparatus of the above embodiment and modifications has high reliability while being ultra-small, the image pickup apparatus can be preferably used particularly as an image pickup apparatus disposed at a distal end portion of an electronic endoscope.

Modification

Next, methods for producing image pickup apparatuses 10A and 10B of Modifications 1 and 2 of the embodiment of the present invention are described. Since the methods for producing the image pickup apparatuses 10A and 10B are similar to the method for producing the image pickup apparatus 10 and have the same effects, same constituent elements are assigned same reference numerals, and description thereof is omitted.

Figure 7:
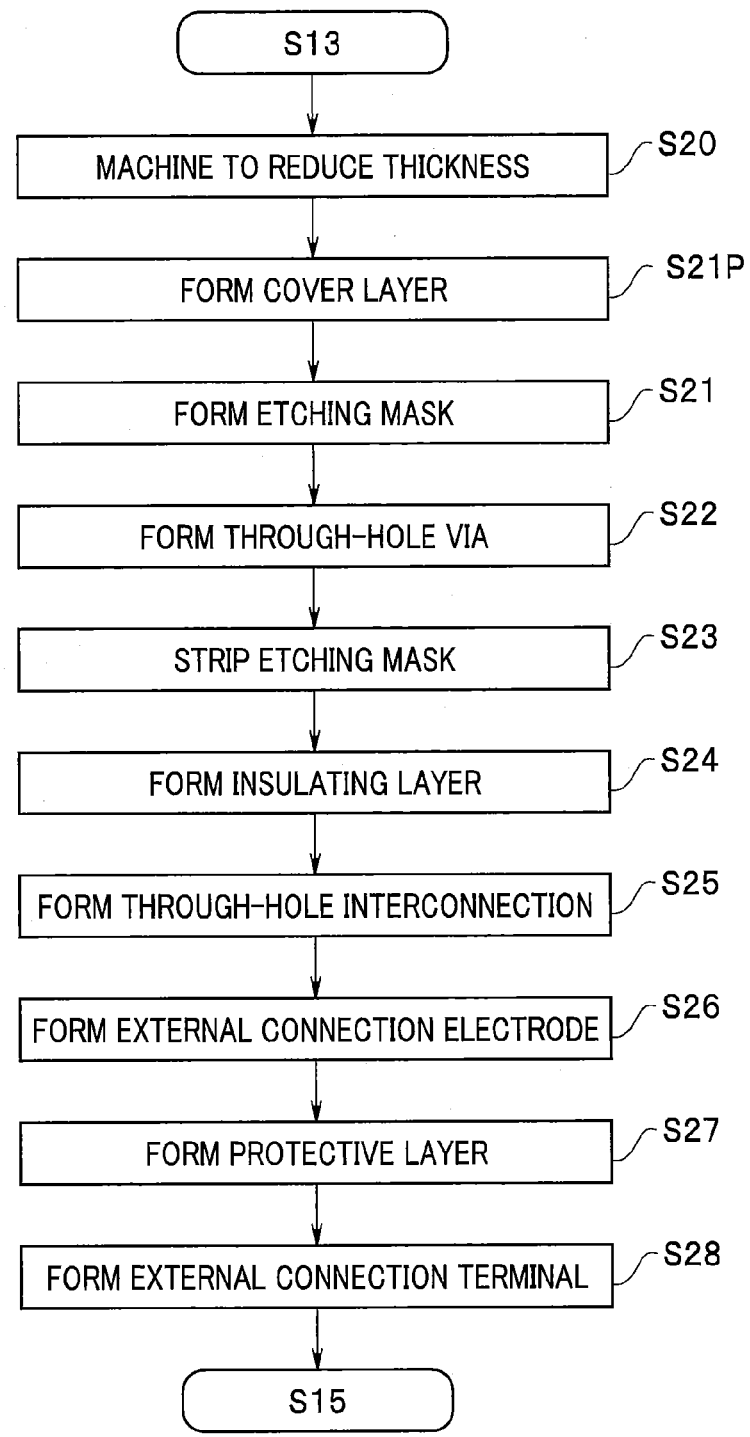
FIG. 7 is a flowchart for explaining a method for producing an image pickup apparatus of Modification 1.

As shown in a flowchart in FIG. 7, in the method for producing the image pickup apparatus 10A of Modification 1, a cover layer 45 is formed in first step S21P of the wafer process.

Figure 8:
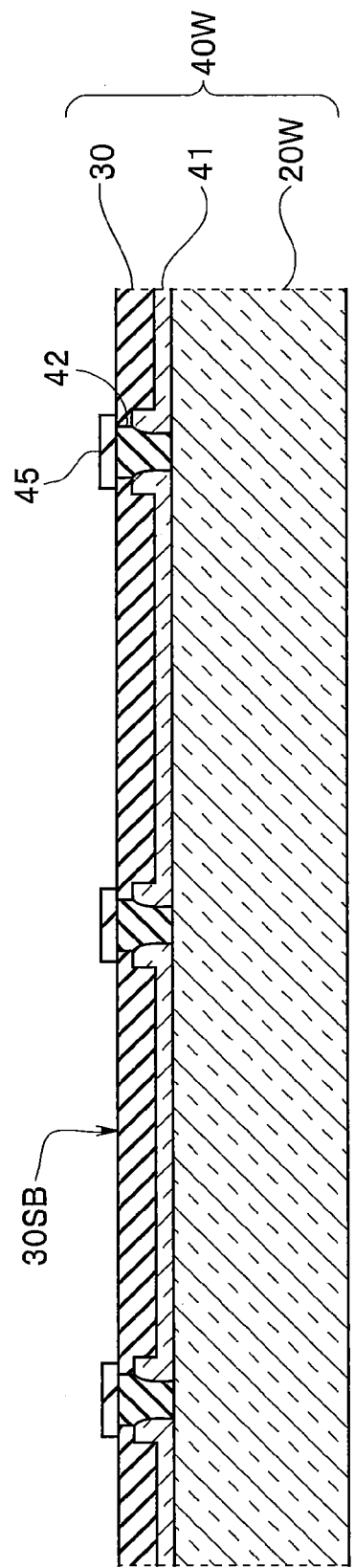
FIG. 8 is a sectional view for explaining the method for producing the image pickup apparatus of Modification 1.
Figure 9:
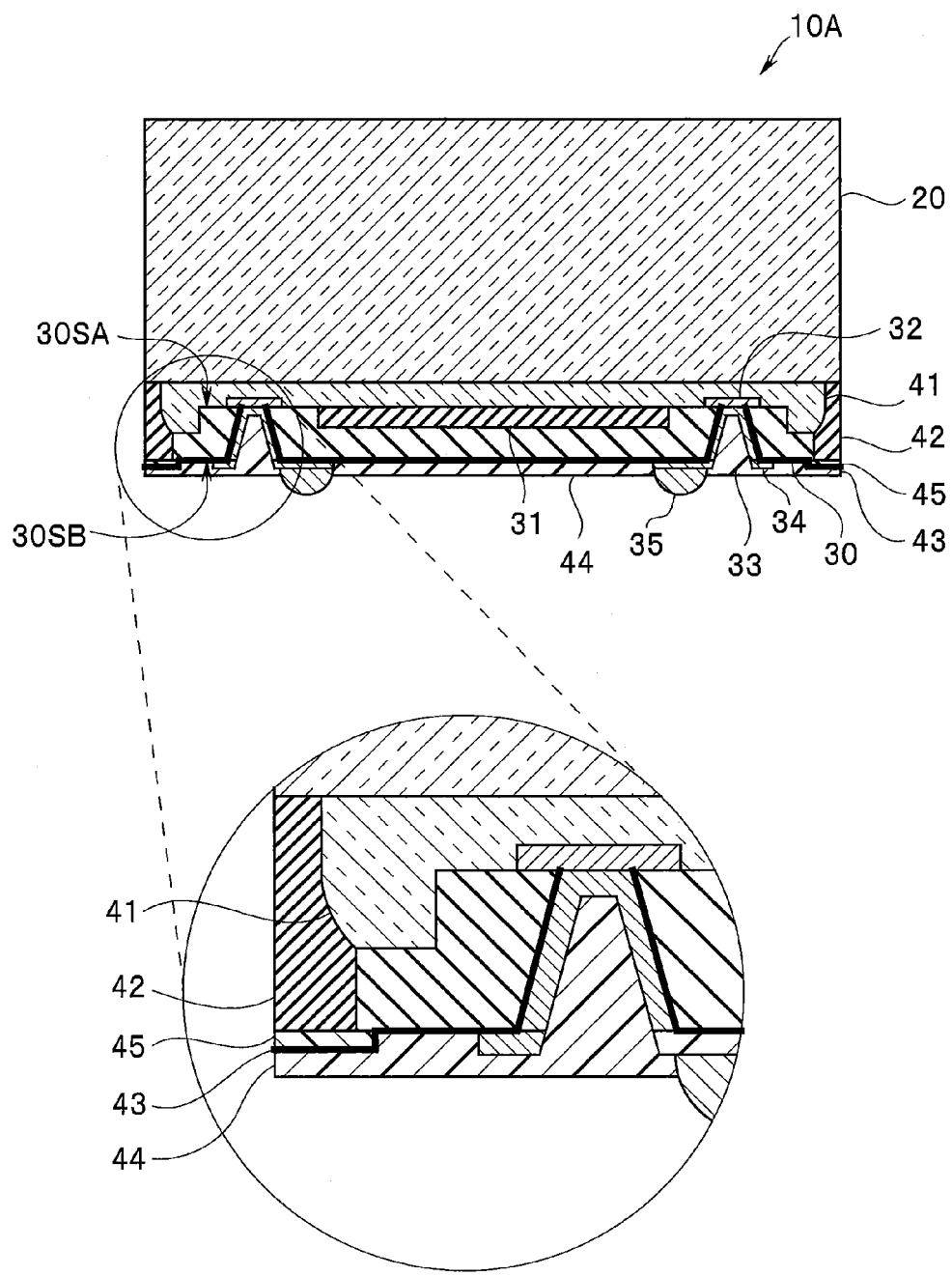
FIG. 9 is a sectional view and a partially enlarged sectional view of the image pickup apparatus of Modification 1.

As shown in FIG. 8, the cover layer 45 is formed so as to cover the surface of the sealing member 42 that is exposed on the second main face 30SB in the thickness reduction machining process in step S20. Since the cover layer 45 is not stripped in the following processes, the cover layer 45 keeps protecting the sealing member 42 as shown in FIG. 9.

Since the etching mask 39 is stripped in a subsequent process, the cover layer 45 made of a different material from the etching mask 39 is used. Also, the cover layer 45 may be formed of a material and by a formation method similar to those of the insulating layer 43 and the protective layer 44, or of a different material and by a different formation method therefrom.

The method for producing the image pickup apparatus 10A of Modification 1 has the effects of the method for producing the image pickup apparatus 10, and can further surely protect the sealing member 42.

Figure 10:
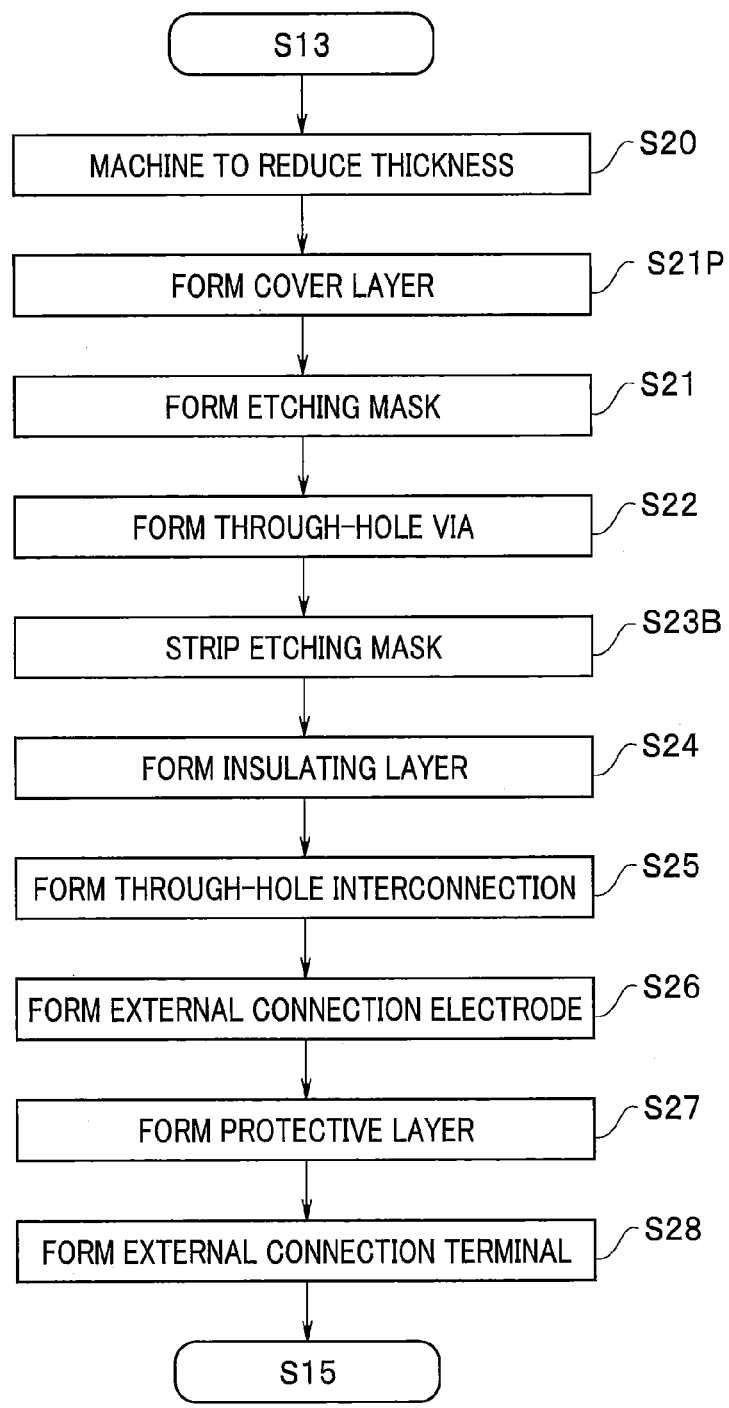
FIG. 10 is a flowchart for explaining a method for producing an image pickup apparatus of Modification 2.

As shown in a flowchart in FIG. 10, an etching mask stripping process S23B is characteristic in the method for producing the image pickup apparatus 10B of Modification 2.

Figure 11A:
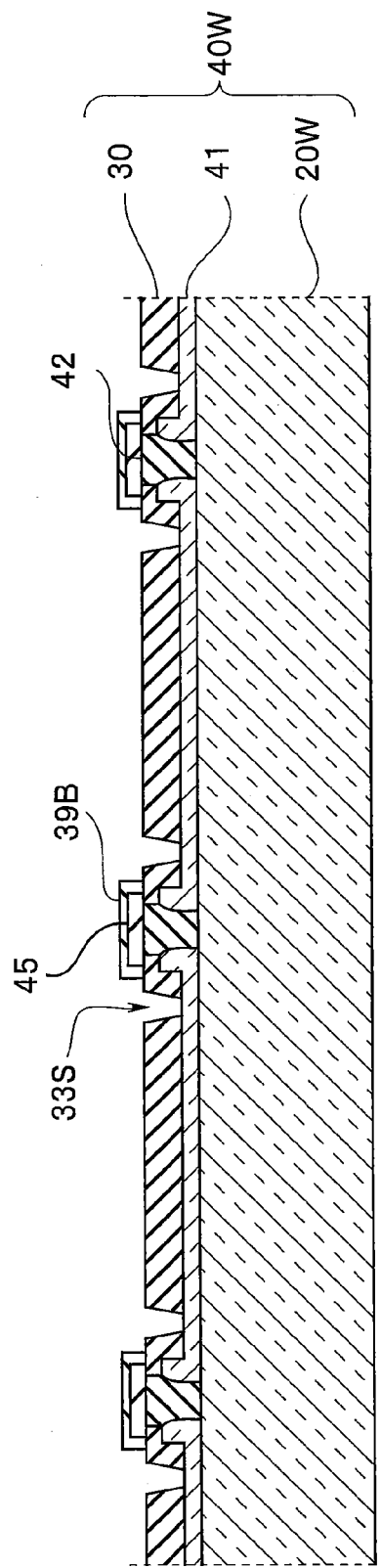
FIG. 11A is a sectional view for explaining the method for producing the image pickup apparatus of Modification 2.

In the etching mask stripping process in step S23 of the embodiment, the entire etching mask 39 is stripped. On the contrary, in the etching mask stripping process S23B, an etching mask 39B in a region covering the sealing member 42 is not stripped as shown in FIG. 11A.

Figure 11B:
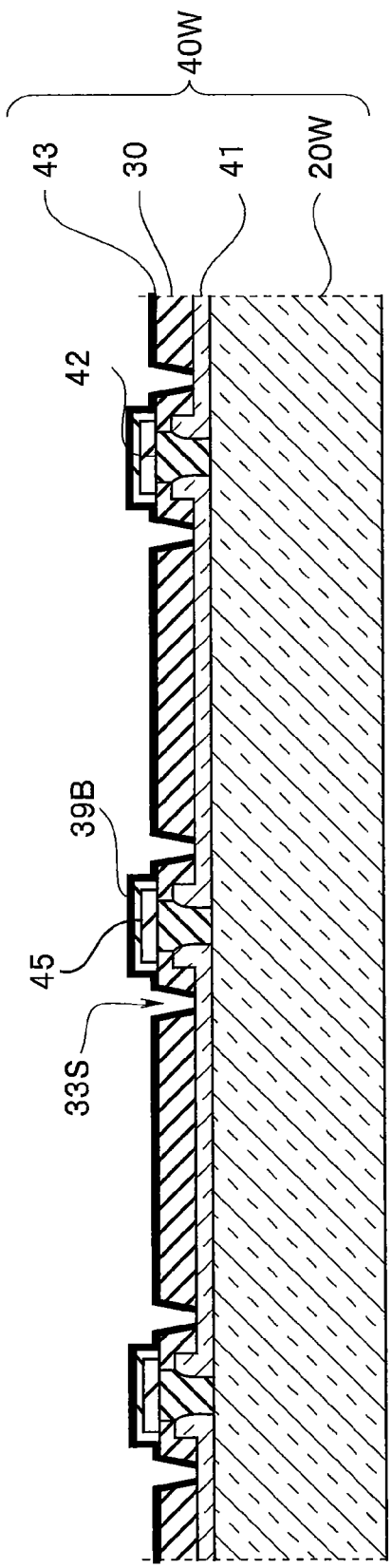
FIG. 11B is a sectional view for explaining the method for producing the image pickup apparatus of Modification 2.
Figure 12:
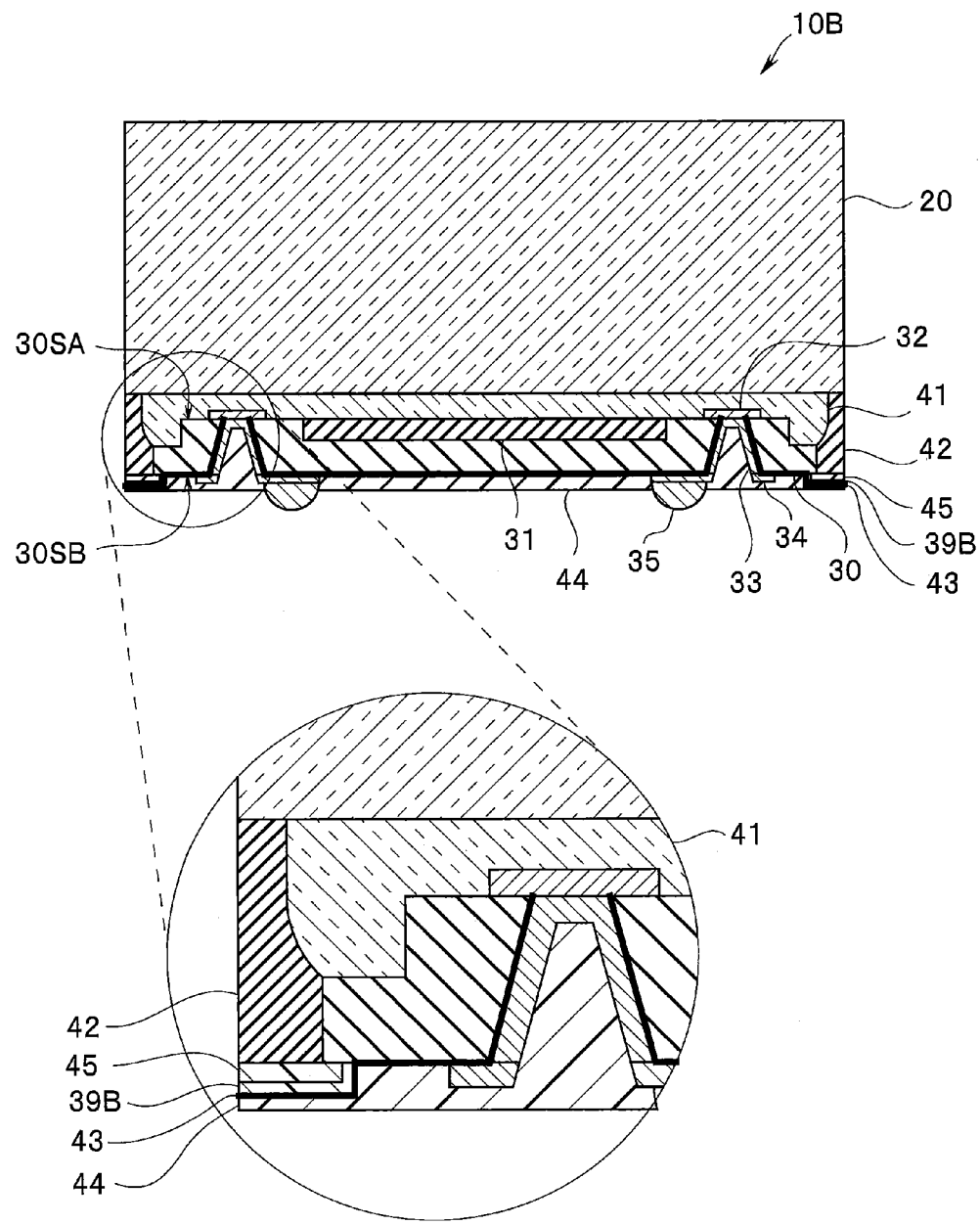
FIG. 12 is a sectional view and a partially enlarged sectional view of the image pickup apparatus of Modification 2.

As shown in FIG. 11B, in the insulating layer forming process S24, the insulating layer 43 that covers the second main face 30SB of the image pickup chip 30, a surface of the etching mask 39B covering the sealing member 42, and the wall face of the through-hole via 33S is formed. As shown in FIG. 12, the cover layer 45, the etching mask 39B, and the insulating layer 43 are not stripped in the following processes. Therefore, the sealing member 42 is protected by not only the cover layer 45 and the insulating layer 43, but also the etching mask 39B.

The method for producing the image pickup apparatus 10B of Modification 2 has the effects of the method for producing the image pickup apparatus 10 or the like, and can further more surely protect the sealing member 42.

That is, the present invention is not limited to the aforementioned embodiment or the like, and various changes, modifications, combinations etc. can be made therein without departing from the scope of the present invention.

What is claimed is:

1. A method for producing an image pickup apparatus comprising:
   a process of fabricating a plurality of image pickup chips by cutting an image pickup chip substrate where a plurality of light receiving sections are formed on a first main face and electrode pads are formed around each of the light receiving sections;
   a process of fabricating a joined wafer by bonding the first main face of each of the image pickup chips to a transparent support substrate via a transparent adhesive layer;
   a process of filling a gap between the plurality of image pickup chips bonded to the joined wafer with a sealing member made of a BCB resin or polyimide;
   a process of machining the joined wafer from a second main face side to reduce a thickness;
   a process of forming an etching mask on the second main face;
   a process of forming through-hole vias in the image pickup chips by using the etching mask;
   a process of stripping the etching mask;
   a process of forming an insulating layer that covers the second main face of the image pickup chips, a surface of the sealing member, and a wall face of the through-hole vias;
   a process of forming through-hole interconnections, each of which is connected to each of the electrode pads via each of the through-hole vias;
   a process of forming external connection electrodes, each of which is connected to each of the through-hole interconnections on the second main face; and
   a process of cutting the joined wafer.

2. The method for producing an image pickup apparatus according to claim 1, wherein a light shielding material is mixed in the sealing member.

3. The method for producing an image pickup apparatus according to claim 1, further comprising:
   a process of forming a cover layer that covers the sealing member exposed on the second main face, between the process of reducing the thickness and the process of forming the etching mask; and
   a process of forming a protective layer including an opening where a portion of each of the external connection electrodes is exposed between the process of forming the external connection electrodes and the process of cutting,
   wherein the cover layer is made of a material which is same as a material of the insulating layer or the protective layer.

4. A method for producing a semiconductor apparatus comprising:
   a process of fabricating a plurality of semiconductor chips by cutting a semiconductor chip substrate where a plurality of semiconductor circuit sections are formed on a first main face and electrode pads are formed around each of the semiconductor circuit sections;
   a process of fabricating a joined wafer by bonding the first main face of each of the semiconductor chips to a support substrate via an adhesive layer;
   a process of filling a gap between the plurality of semiconductor chips bonded to the joined wafer with a sealing member made of a BCB resin or polyimide;
   a process of machining the joined wafer from a second main face side to reduce a thickness;
   a process of forming an etching mask on the second main face;
   a process of forming through-hole vias in the semiconductor chips by using the etching mask;
   a process of stripping the etching mask;
   a process of forming an insulating layer that covers the second main face of the semiconductor chips, a surface of the sealing member, and a wall face of the through-hole vias;
   a process of forming through-hole interconnections, each of which is connected to each of the electrode pads via each of the through-hole vias;
   a process of forming external connection electrodes, each of which is connected to each of the through-hole interconnections on the second main face; and
   a process of cutting the joined wafer.

5. The method for producing a semiconductor apparatus according to claim 4, wherein a light shielding material is mixed in the sealing member.

6. The method for producing a semiconductor apparatus according to claim 4, further comprising:
   a process of forming a cover layer that covers the sealing member exposed on the second main face, between the process of reducing the thickness and the process of forming the etching mask; and
   a process of forming a protective layer including an opening where a portion of each of the external connection electrodes is exposed, between the process of forming the external connection electrodes and the process of cutting,
   wherein the cover layer is made of a material which is same as a material of the insulating layer or the protective layer.

7. A joined wafer comprising:
   a plurality of image pickup chips each including through-hole vias that penetrate through between a first main face and a second main face;
   a transparent support substrate bonded on the first main face of each of the plurality of image pickup chips via a transparent adhesive layer; and
   a sealing member made of a BCB resin or polyimide, the sealing member being filled in a gap between the plurality of image pickup chips bonded to the transparent support substrate, wherein a surface of the sealing member and a wall face of each of the through-hole vias are covered with an insulating layer, and each of the image pickup chips includes: a light receiving section formed on the first main face; electrode pads formed around the light receiving section; through-hole interconnections, each of which is connected to each of the electrode pads via each of the through-hole vias; and external connection electrodes, each of which is connected to each of the through-hole interconnections and formed on the second main face.

8. The joined wafer according to claim 7, wherein a light shielding material is mixed in the sealing member.

9. The joined wafer according to claim 7, further comprising:

a cover layer that covers the sealing member exposed on the second main face; and a protective layer including an opening where a portion of each of the external connection electrodes is exposed, wherein the cover layer is made of a material which is same as a material of the insulating layer or the protective layer.

10. A joined wafer comprising:

a plurality of semiconductor chips each including through-hole vias that penetrate through between a first main face and a second main face;

a transparent support substrate bonded on the: first main face of each of the plurality of semiconductor chips via a transparent adhesive layer; and a sealing member made of a BCB resin or polyimide, the sealing member being filled in a gap between the plurality of semiconductor chips bonded to the transparent support substrate, wherein a surface of the sealing member and a wall face of each of the through-hole vias are covered with an insulating layer, and each of the semiconductor chips includes: a semiconductor circuit section formed on the first main face; electrode pads formed around the semiconductor circuit section; through-hole interconnections, each of which is connected to each of the electrode pads via each of the through-hole vias; and external connection electrodes, each of which is connected to each of the through-hole interconnections and formed on the second main face.

11. The joined wafer according to claim 10, wherein a light shielding material is mixed in the sealing member.

12. The joined wafer according to claim 10, further comprising:

a cover layer that covers the sealing member exposed on the second main face; and a protective layer including an opening where a portion of each of the external connection electrodes is exposed, wherein the cover layer is made of a material which is same as a material of the insulating layer or the protective layer.

* * * * *